(12) United States Patent
Bhuiyan

(10) Patent No.: US 8,766,695 B1
(45) Date of Patent: Jul. 1, 2014

(54) CLOCK GENERATION AND DELAY ARCHITECTURE

(71) Applicant: Sandisk Technologies Inc., Plano, TX (US)

(72) Inventor: Ekram H. Bhuiyan, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 13/730,595

(22) Filed: Dec. 28, 2012

(51) Int. Cl.
*G06F 1/04* (2006.01)

(52) U.S. Cl.
USPC ............ 327/291; 327/299; 327/158; 327/161

(58) Field of Classification Search
USPC ......... 327/158–159, 161–162, 291, 293–294, 327/298–299
See application file for complete search history.

(56) References Cited

U.S. PATENT DOCUMENTS

| | | | |
|---|---|---|---|
| 6,570,944 B2 * | 5/2003 | Best et al. ...................... | 375/355 |
| 6,617,936 B2 * | 9/2003 | Dally et al. ...................... | 331/57 |
| 6,798,678 B2 * | 9/2004 | Komurasaki et al. ......... | 363/157 |
| 7,009,433 B2 | 3/2006 | Zhang et al. | |
| 7,157,948 B2 | 1/2007 | McClannahan et al. | |
| 7,234,069 B1 | 6/2007 | Johnson | |
| 7,388,795 B1 | 6/2008 | To et al. | |
| 7,495,519 B2 * | 2/2009 | Kim et al. ...................... | 331/44 |
| 7,642,823 B2 * | 1/2010 | Cho .............................. | 327/156 |
| 2006/0164141 A1 * | 7/2006 | Self .............................. | 327/158 |

FOREIGN PATENT DOCUMENTS

WO WO 2007/105156 9/2007

OTHER PUBLICATIONS

PCT International Search Report and Written Opinion dated Jan. 24, 2014 issued in PCT/US2013/066821.

* cited by examiner

*Primary Examiner* — An Luu
(74) *Attorney, Agent, or Firm* — Weaver Austin Villeneuve & Sampson LLP

(57) ABSTRACT

This disclosure provides examples of circuits, devices, systems, and methods for generating a reference clock signal and delaying a received clock signal based on the reference clock signal. In one implementation, a circuit includes a control block configured to generate a control signal. The circuit includes an oscillator configured to generate a reference clock signal. The oscillator includes a plurality of delay elements each configured to receive the control signal and to introduce a delay in the reference clock signal based on the control signal. The delay elements of the oscillator are arranged to generate the reference clock signal. The circuit further includes a delay block configured to receive a clock signal and to generate a delayed clock signal. The delay block includes one or more delay elements each configured to receive the control signal and to introduce a delay in the clock signal based on the control signal.

23 Claims, 10 Drawing Sheets

CLOCK GENERATION AND DELAY ARCHITECTURE

TECHNICAL FIELD

This disclosure relates generally to data recovery circuits in memory systems, and more specifically, to a clock generation and delay circuit that includes an oscillator circuit that incorporates functionality of a delay-locked loop (DLL) circuit.

DESCRIPTION OF THE RELATED TECHNOLOGY

Data recovery circuits are utilized in a variety of devices and systems. For example, data recovery circuits can be used in a variety of nonvolatile memory systems and for a variety of applications. Some nonvolatile memory systems are embedded in a larger system such as a personal computer, for example, as a Solid State Drive (SSD). Other removable nonvolatile memory systems are connected to a host system and may be interchanged between different host systems. Examples of nonvolatile memory systems include memory cards, USB flash drives, and removable SSDs. Electronic circuit cards, including non-volatile memory cards, have been commercially implemented according to a number of well-known standards. Memory cards are used with personal computers, cellular telephones, personal digital assistants (PDAs), digital still cameras, digital movie cameras, portable audio players and other host electronic devices for the storage of large amounts of data. Such cards usually contain a re-programmable non-volatile semiconductor memory cell array along with a controller that controls and supports operation of the memory cell array and interfaces with a host to which the card is connected. Several of the same type of card may be interchanged in a host card slot designed to accept that type of card. Memory card standards include PC Card, CompactFlash™ card (CF™ card), SmartMedia™ card, MultiMediaCard (MMC™), Secure Digital (SD) card, a miniSD™ card, Subscriber Identity Module (SIM), Memory Stick™, Memory Stick Duo card and microSD/TransFlash™ memory module standards.

In some traditional data recovery circuits, a reference clock signal is generated in the host by an oscillator. For example, the oscillator can be a voltage-controlled oscillator (VCO). VCOs include linear ("harmonic") oscillators and nonlinear ("relaxation") oscillators. Example harmonic oscillators include crystal oscillators and inductor-capacitor (LC)-tank oscillators. Example relaxation oscillators include resistor-capacitor (RC) oscillators and delay line oscillators including delay-based ring oscillators. The oscillator also can include a phase-locked loop (PLL) circuit. The data recovery circuit also generally includes a separate delay-locked loop (DLL) circuit. The DLL circuit is configured to receive the reference clock signal generated by the oscillator and to generate a control signal based on the reference clock signal. The DLL circuit also can be configured to receive a clock signal transmitted with a data signal, such as from a client device. The DLL circuit delays the clock signal received with the data signal based on the control signal to produce a delayed clock signal having a desired phase shift (e.g., 90 degrees or 45 degrees). For example, the DLL circuit could be used to shift the phase of the rising edge of the clock signal such that the rising edge is aligned with the middle of the corresponding data periods in the data signal. The delayed clock signal can then be sent to a sampler, which samples the data in the data signal based on the edges of the delayed clock signal to generate a recovered data signal.

SUMMARY

This disclosure provides examples of circuits, devices, systems, and methods for generating a reference clock signal and delaying a received clock signal based on the reference clock signal. In one aspect, a circuit includes a control block configured to generate a common control signal. The circuit additionally includes an oscillator configured to generate a reference clock signal. The oscillator includes a plurality of delay elements, each of which is configured to receive the common control signal and to introduce a delay in the reference clock signal based on the common control signal. The delay elements of the oscillator are collectively arranged so as to generate the reference clock signal when the oscillator is oscillating. The circuit further includes a delay block configured to receive a clock signal and to generate a delayed clock signal. The delay block includes one or more delay elements, each of which is configured to receive the common control signal and to introduce a delay in the clock signal based on the common control signal. The delay elements of the delay block are arranged so as to delay the clock signal to generate the delayed clock signal.

In some implementations, the control block is further configured to receive a program signal and the control block generates the common control signal based on the program signal. In some implementations, the value of the common control signal is fixed for a given value of the program signal. In some implementations, the control block is further configured to receive the reference clock signal, convert a frequency of the reference clock signal to a voltage signal or a current signal, produce a reference voltage signal or a reference current signal based on the program signal, compare the voltage or current signal with the reference voltage or reference current signal, respectively, and generate the common control signal based on the comparison.

In some implementations, the delay elements of the oscillator are arranged in a relaxation oscillator configuration. In some such implementations, the delay elements of the oscillator are arranged in a delay-based ring oscillator configuration. In some implementations, the circuit further comprises an inverting logic gate configured to receive as input an enable signal and the reference clock signal. The output of the inverting logic gate is coupled to a first one of the delay elements of the oscillator. The enable signal is configured to trigger oscillation of the oscillator. In some implementations, the oscillator includes eight serially-coupled delay elements arranged in four serially-coupled pairs. In some such implementations, each pair of delay elements in the oscillator is configured to introduce an approximately 90 degree phase delay in the reference clock signal when receiving the common control signal. In some implementations, the delay elements of the oscillator are substantially identical to the delay elements of the delay block. In some implementations, the delay block includes two serially-coupled delay elements that are collectively configured to introduce an approximately 90 degree phase delay in the clock signal when receiving the common control signal. In some implementations, each delay element includes an inverter or inverting circuit.

In another aspect, a circuit includes a control block configured to generate a common control signal. The circuit additionally includes an oscillator configured to generate a reference clock signal. The oscillator includes a plurality of delay elements, each of which is configured to receive the common control signal and to introduce a delay in the reference clock signal based on the common control signal. The delay elements of the oscillator are collectively arranged so as to generate the reference clock signal when the oscillator is oscillating. The circuit further includes a delay block configured to receive a clock signal and to generate a delayed clock signal. The delay block includes one or more delay elements, each of which is configured to receive the common control signal and to introduce a delay in the clock signal based on the common control signal. The delay elements of the delay block are arranged so as to delay the clock signal to generate the delayed clock signal. The circuit further includes a data sampler configured to receive a data signal comprising bits of data and to sample the data signal based on the delayed clock signal.

In some implementations, the clock signal is transmitted with the data signal and the clock signal is transmitted only with the data signal and not at other times. In some implementations, the control block is further configured to receive a program signal and the control block generates the common control signal based on the program signal. In some implementations, the value of the common control signal is fixed for a given value of the program signal. In some implementations, the control block is further configured to receive the reference clock signal, convert a frequency of the reference clock signal to a voltage signal or a current signal, produce a reference voltage signal or a reference current signal based on the program signal, compare the voltage or current signal with the reference voltage or reference current signal, respectively, and generate the common control signal based on the comparison.

In some implementations, the delay elements of the oscillator are arranged in a relaxation oscillator configuration. In some such implementations, the delay elements of the oscillator are arranged in a delay-based ring oscillator configuration. In some implementations, the circuit further comprises an inverting logic gate configured to receive as input an enable signal and the reference clock signal. The output of the inverting logic gate is coupled to a first one of the delay elements of the oscillator. The enable signal being configured to trigger oscillation of the oscillator. In some implementations, the delay elements of the oscillator are substantially identical to the delay elements of the delay block. In some implementations, each delay element includes an inverter or inverting circuit.

In another aspect, a circuit includes a control block configured to receive a program signal and to generate a common control signal based on the program signal. The circuit includes an oscillator configured to generate a reference clock signal. The oscillator includes a plurality of delay elements arranged in a delay-based ring oscillator configuration. Each delay element of the oscillator is configured to receive the common control signal and to introduce a delay in the reference clock signal based on the common control signal. The delay elements of the oscillator are collectively arranged so as to generate the reference clock signal when the oscillator is oscillating. The reference clock signal is fed back to an input of the oscillator. The circuit additionally includes a delay block configured to receive a clock signal and to generate a delayed clock signal. The delay block includes one or more delay elements. The delay elements of the delay block are substantially identical to the delay elements of the oscillator. Each delay element of the delay block is configured to receive the common control signal and to introduce a delay in the clock signal based on the common control signal. The delay elements of the delay block are arranged so as to delay the clock signal to generate the delayed clock signal. The circuit further includes a data sampler configured to receive a data signal comprising bits of data and to sample the data signal based on the delayed clock signal.

In some implementations, the clock signal is transmitted with the data signal and the clock signal is transmitted only with the data signal and not at other times. In some implementations, the value of the common control signal is fixed for a given value of the program signal. In some implementations, the control block is further configured to receive the reference clock signal, convert a frequency of the reference clock signal to a voltage signal or a current signal, produce a reference voltage signal or a reference current signal based on the program signal, compare the voltage or current signal with the reference voltage or reference current signal, respectively, and generate the common control signal based on the comparison.

BRIEF DESCRIPTION OF THE DRAWINGS

Like reference numbers and designations in the various drawings indicate like elements.

DETAILED DESCRIPTION

This disclosure provides examples of circuits, devices, systems, and methods for generating a reference clock signal, receiving a clock signal transmitted in parallel with a data signal, and delaying the received clock signal based on the reference clock signal such that the delayed clock signal can be used to recover the data in the data signal. Particular implementations described herein relate to a clock-generating oscillator circuit that includes at least some functionality of a delay-locked loop (DLL) circuit. In some implementations, the DLL functionality is available whenever the oscillator is generating a reference clock signal.

The circuits described herein can be utilized in a variety of applications. Generally, the circuits described herein are used in digital electronic devices or systems. For example, in some implementations, the circuits described herein can be used in a memory device or system. For example, the circuits can be used in solid state memory devices such as memory cards, USB flash drives, and removable solid state drives (SSDs), as well as devices or systems that are configured to receive such cards, drives, or other memory devices.

Figure 1:
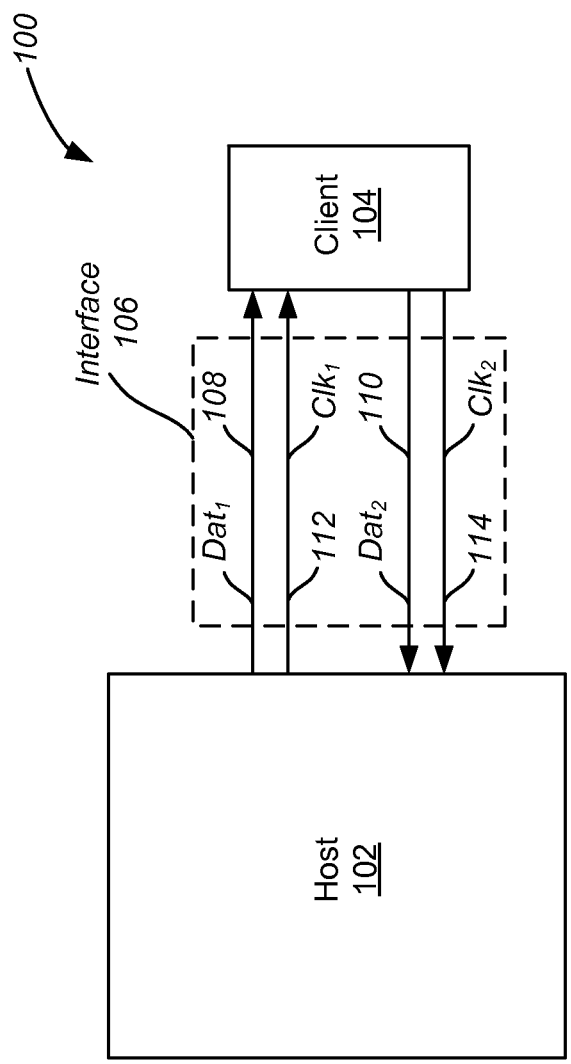
FIG. 1 shows an example memory system 100.

FIG. 1 shows an example memory system 100. Memory system 100 includes a host 102 and a client 104. An interface 106 enables communication between the host 102 and the client 104. The host 102 can be, for example, a computer, computing device, or display device such as a general purpose computer, personal computer (PC), laptop computer, tablet computer, mobile electronic device, e-reader, ultra-mobile PC, personal digital assistant (PDA), digital camera, digital video or audio recorder, cellular phone, smartphone, multimedia device, or MP3 player, among other suitable host devices or systems. In some implementations, the client 104 can be a removable device. For example, the client 104 can be a USB flash drive, removable SSD, or a memory card such as, for example, a PC Card, a CF™ card, a SmartMedia™ card, an MMC™ card, an SD card, a miniSD™ card, a SIM card, a Memory Stick™ card, a Memory Stick Duo card, a microSD/TransFlash™ card, a Compact Flash card, or an iNAND card. In some other implementations, the circuits can be used in other devices or systems. For example, the host 102 can be a processor or memory controller and the client 104 can be a memory external to the processor or memory controller but within the same device or system. Generally, various implementations described herein can be used in any circuit configured to transmit and receive data.

In the example shown, the interface 106 includes an electronic bus that enables bidirectional communication between the host 102 and the client 104. The interface 106 includes a host-side portion (not shown) and a client-side portion (not shown) that when combined or connected enable the communication of a data signal $Dat_1$ from the host 102 to the client 104 along a channel 108, and a data signal $Dat_2$ from the client 104 to the host 102 along a channel 110. In some implementations, the channels 108 and 110 are one and the same physical channel that enables bi-directional communication. The interface 106 also enables the communication of a clock signal $Clk_1$ from the host 102 to the client 104 along a channel 112, and a clock signal $Clk_2$ from the client 104 to the host 102 along a channel 114. In some implementations, the channels 112 and 114 are one and the same physical channel that enables bi-directional communication. The clock signals $Clk_1$ and $Clk_2$ are transmitted with the respective data signals $Dat_1$ or $Dat_2$. In some implementations, when the host 102 is not transmitting data signal $Dat_1$ to the client 104, the host does not transmit the clock signal $Clk_1$. Similarly, when the client 104 is not transmitting data signal $Dat_2$ to the host 102, the client does not transmit the clock signal $Clk_2$.

The host 102 is configured to recover the data in the data signal $Dat_2$ received from the client 104. Similarly, the client 104 is configured to recover the data in the data signal $Dat_1$ received from the host 102. Data recovery generally involves sampling a data signal according to a clock signal, and generating a recovered data signal based on the sampled data. The process of sampling the bits in the data signal can be referred to as "latching" or "strobing" the data. Unlike traditional clock and data recovery (CDR) circuits, in the implementations described herein, the clock signal is not recovered from the data signal. Rather, the clock signals $Clk_1$ and $Clk_2$ are transmitted in parallel with the data signals $Dat_1$ and $Dat_2$, respectively. Such clock signals $Clk_1$ and $Clk_2$ can be referred to as strobe signals. Strobe signals are generally used to synchronize data transmitted over an electrical bus in systems in which the communicating devices on either side of the bus do not share a common clock.

In some implementations, the host 102 may, for example, generate and transmit the data signal $Dat_1$ in response to a write request. For example, the data signal $Dat_1$ can include bits for a data file to be stored in the client 104. To store the data file, the client 104 aligns the clock signal $Clk_1$ with the data signal $Dat_1$ and then samples the bits in the data signal $Dat_1$ based on the clock signal $Clk_1$. The client 104 may, for example, generate and transmit the data signal $Dat_2$ in response to a read request. For example, the data signal $Dat_2$ can include bits for a data file retrieved from the client 104 to be read by the host 102. To read the retrieved data file, the host 102 aligns the clock signal $Clk_2$ with the data signal $Dat_2$ and then samples the bits in the data signal $Dat_2$ based on the clock signal $Clk_2$.

Figure 2:
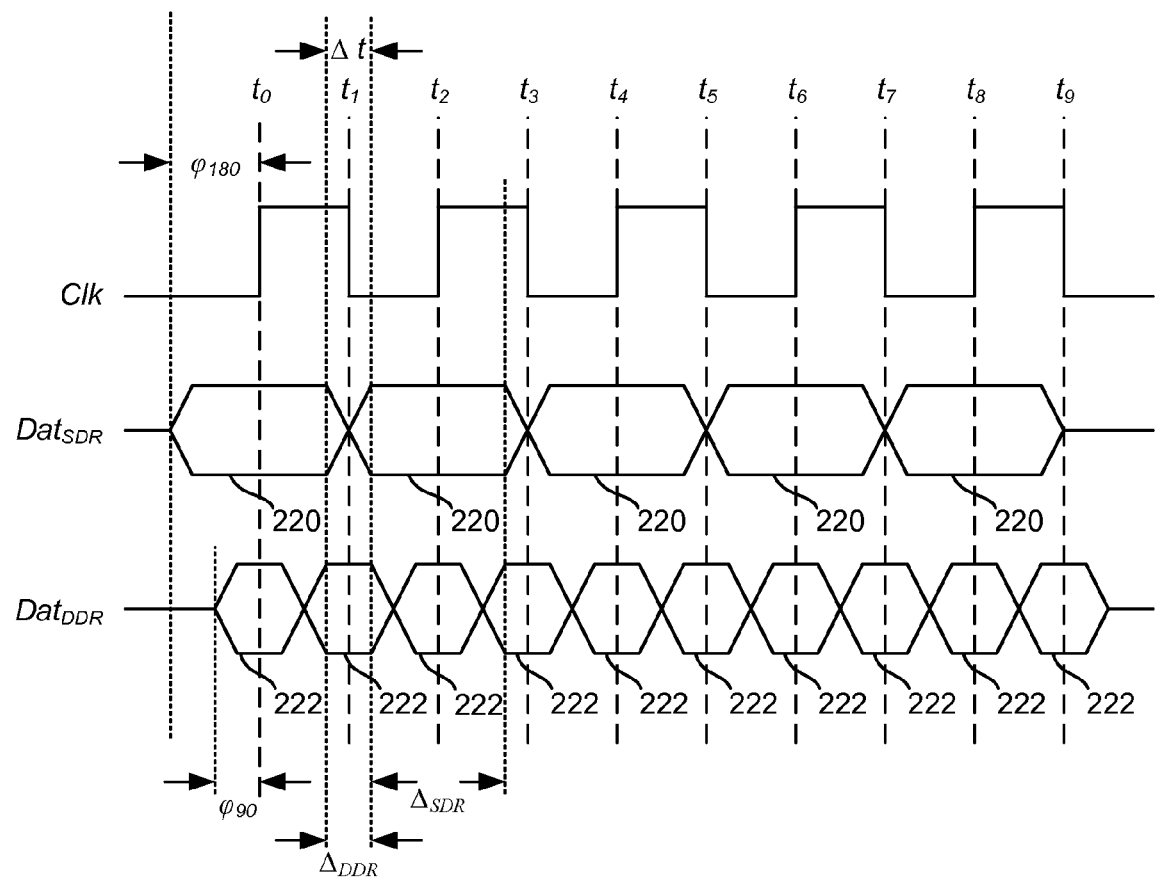
FIG. 2 shows a timing diagram depicting an example clock signal, an example single-data-rate (SDR) data signal, and an example double-data-rate (DDR) data signal.

In some implementations, the memory system 100 is configured as a double-data-rate (DDR) memory system. FIG. 2 shows a timing diagram depicting an example clock signal Clk, an example single-data-rate (SDR) data signal $Dat_{SDR}$, and an example DDR data signal $Dat_{DDR}$. As shown in FIG. 2, the bits 220 of SDR data are strobed at the corresponding rising edges of the clock signal Clk, that is, for example, at times $t_0$, $t_2$, $t_4$, $t_6$, and $t_8$. The bits 222 of DDR data are strobed at the corresponding rising edges of the clock signal Clk, at times $t_0$, $t_2$, $t_4$, $t_6$, and $t_8$, respectively, as well as at the corresponding falling edges of the clock signal Clk, that is, at times $t_1$, $t_3$, $t_5$, $t_7$, and $t_9$. In this manner, the DDR data signal $Dat_{DDR}$ transmits data bits at twice the rate as the SDR data signal $Dat_{SDR}$ while using a clock signal having the same frequency.

Figure 3A:
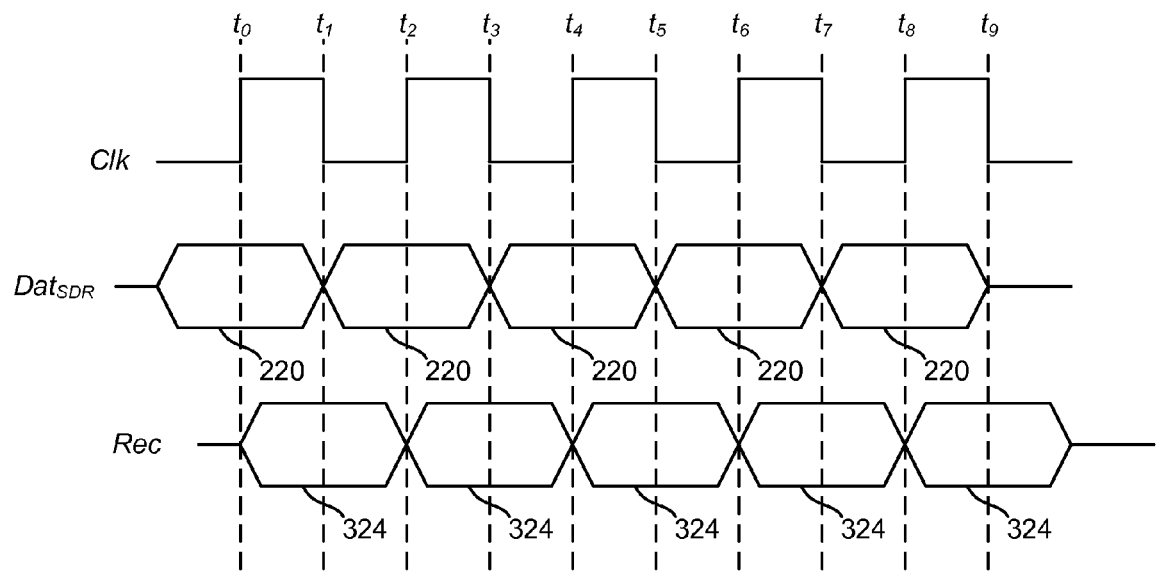
FIG. 3A shows an example recovered data signal including recovered data bits obtained by sampling an SDR data signal according to a clock signal at a suitable phase of the clock signal relative to the data signal.
Figure 3B:
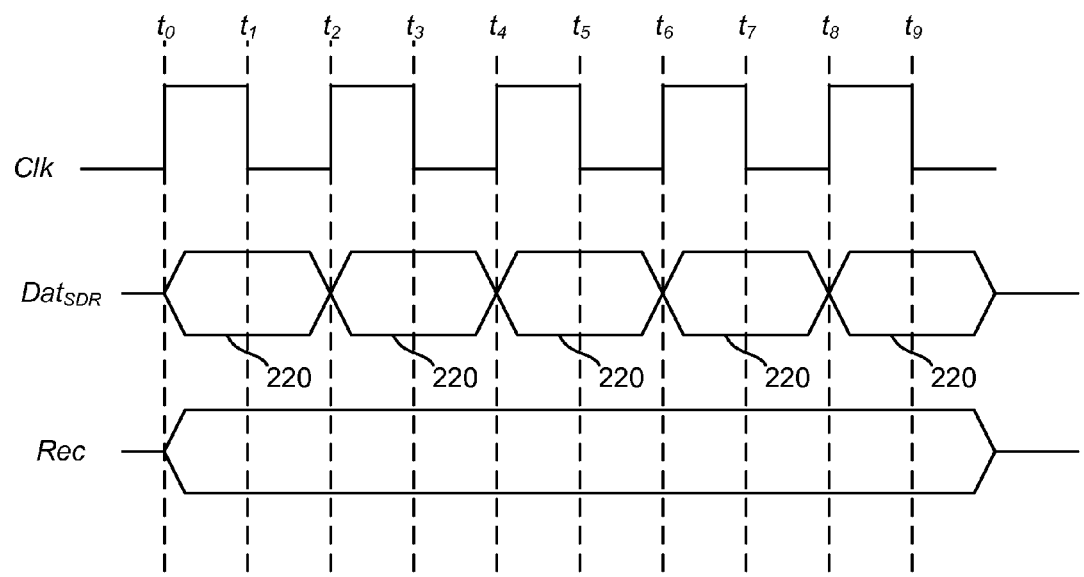
FIG. 3B shows an example recovered data signal obtained by sampling an SDR data signal according to the clock signal at an unsuitable phase of the clock signal relative to the data signal.

FIG. 3A shows an example recovered data signal Rec including recovered data bits 324 obtained by sampling the data signal $Dat_{SDR}$ according to the clock signal Clk at a suitable phase of the clock signal relative to the data signal. FIG. 3B shows an example recovered data signal Rec obtained by sampling the data signal $Dat_{SDR}$ according to the clock signal Clk at an unsuitable phase of the clock signal relative to the data signal. It is generally desirable to sample the data in the middle of the data period $\Delta_{SDR}$, as shown in FIG. 3A. The data in the recovered bitstream Rec shown in FIG. 3A is considered trustworthy because the data in the data signal $Dat_{SDR}$ is sampled in, or within a suitable range from, the center of the data period $\Delta_{SDR}$ when the data value is stable. In contrast, in FIG. 3B, the data in the recovered bitstream Rec is considered untrustworthy or noise because the data in the data signal $Dat_{SDR}$ is sampled during the transition periods $\Delta t$ between adjacent data periods $\Delta_{SDR}$. During these transition periods $\Delta t$, the data may be changing value (e.g., from high/logic "1" to low/logic "0" or from low/0 to high/1) and thus the value of the data signal when sampled may not accurately reflect the correct data value for the bit 220 to be sampled.

The function of a delay-locked loop (DLL) circuit in data recovery circuits is to apply a phase shift to the clock signal Clk to ensure trustworthy recovery of data. For example, a DLL circuit could be used to shift the phase of the rising edge of the clock signal Clk of FIG. 3B such that the rising edge is aligned with the middle of the corresponding data periods $\Delta_{SDR}$ in the data signal $Data_{SDR}$. For example, a DLL circuit could be used to apply a 180 degree phase delay $\phi_{180}$ (where 360 degrees represents a phase shift of one clock period) to the clock signal Clk such that the alignment resembles that of FIGS. 2 and 3A. Similarly, in a DDR architecture, a DLL circuit could be used to apply a 90 degree phase delay $\phi_{90}$ to the clock signal Clk such that the alignment resembles that of FIG. 2. Notably, in the DDR case, a delay of about 90 degrees enables the sampling of data bits at both the rising and falling edges of the clock signal Clk.

Figure 4:
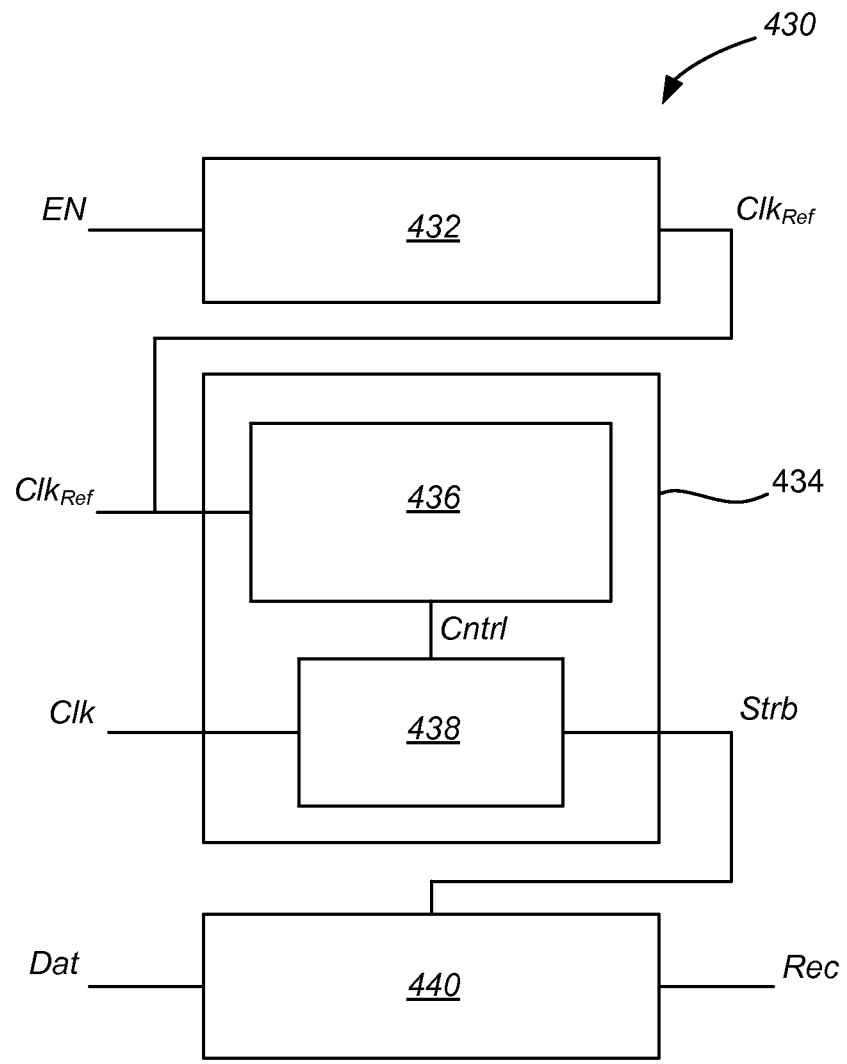
FIG. 4 shows a traditional data recovery circuit.

FIG. 4 shows a traditional data recovery circuit 430. In some applications or implementations, the host 102 includes a data recovery circuit such as the circuit 430. In some implementations, the host 102 includes a different data recovery circuit architecture or design (such as that described below with reference to FIGS. 6 and 7). The data recovery circuit 430 includes an oscillator 432 that generates a reference clock signal $Clk_{Ref}$ when enabled by an enable signal EN. For example, the oscillator 432 can be a voltage-controlled oscillator (VCO). VCOs include linear ("harmonic") oscillators and nonlinear ("relaxation") oscillators. Examples of harmonic oscillators include crystal oscillators and inductor-capacitor (LC)-tank oscillators. Examples of relaxation oscillators include resistor-capacitor (RC) oscillators and delay-based ring oscillators. The oscillator 432 also can include a phase-locked loop (PLL) circuit.

The data recovery circuit 430 also includes a separate DLL circuit 434. The DLL circuit 434 includes a master delay block 436 and a slave delay block 438. The master delay block 436 is configured to receive the reference clock signal $Clk_{Ref}$ generated by the oscillator 432 and to generate a control signal Cntrl based on the reference clock signal $Clk_{Ref}$. The slave delay block 438 is configured to receive a clock signal Clk transmitted with a data signal Dat. For example, in implementations in which the host 102 includes a data recovery circuit 430, the clock signal Clk can be the clock signal $Clk_2$ and the data signal Dat can be the data signal $Dat_2$. The slave delay block 438 is configured to delay the clock signal Clk by a desired phase shift (e.g., about 180 degrees for SDR or about 90 degrees for DDR) to produce a strobe signal Strb. The strobe signal Strb is then sent to the sampler 440, which samples the data in the data signal Dat based on the edges of the strobe signal Strb to generate a recovered data signal Rec.

Figure 5:
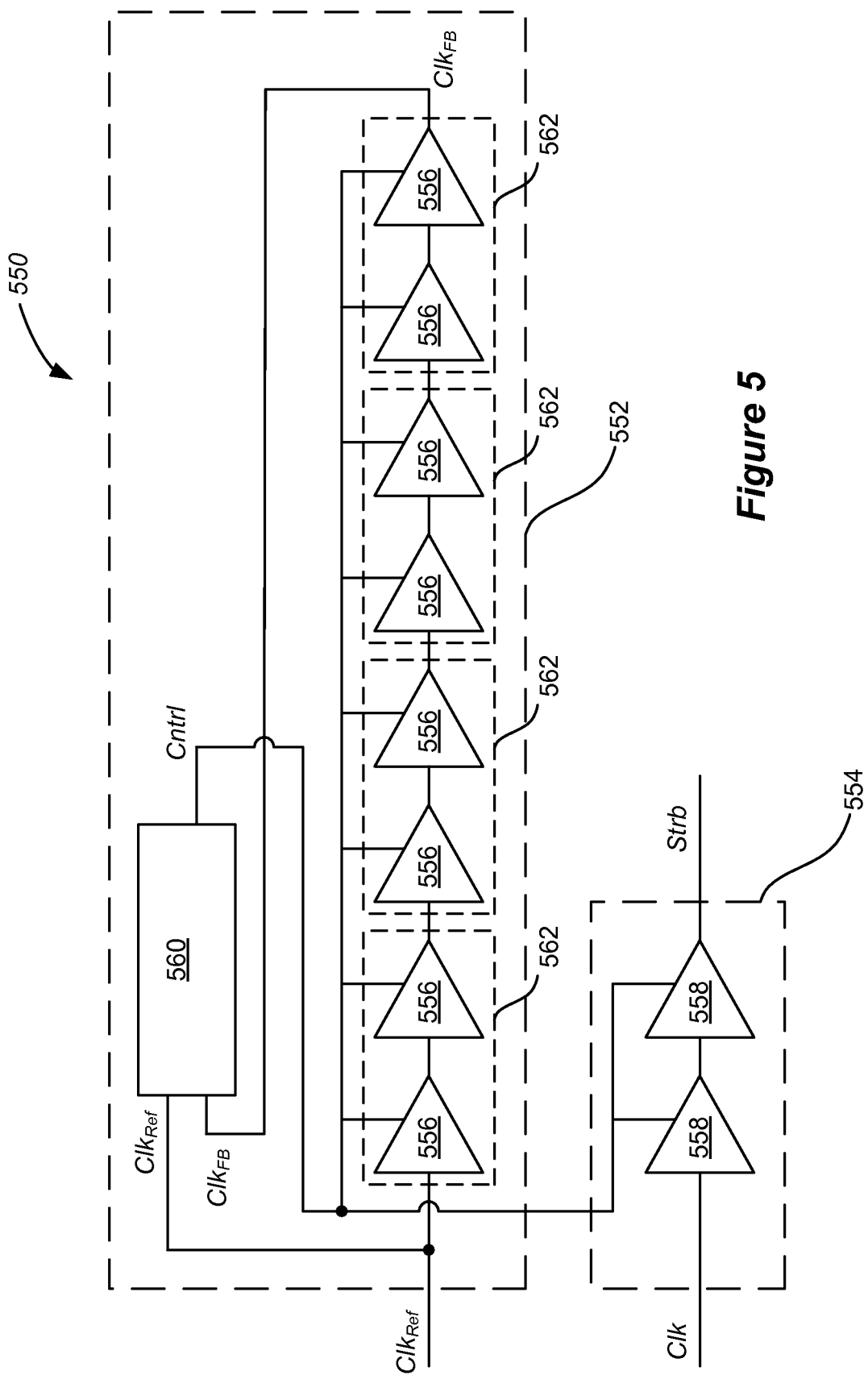
FIG. 5 shows an example DLL circuit for generating a phase-shifted clock signal.

FIG. 5 shows an example DLL circuit 550 for generating a phase-shifted clock signal. For example, the circuit 550 can be used as the DLL circuit 434. Circuit 550 includes a master delay block 552 and a slave delay block 554. Each of the master and slave delay blocks 552 and 554, respectively, includes a number of delay elements. In the illustrated example, the master delay block 552 includes eight delay elements 556 while the slave delay block 554 includes two delay elements 558. In some implementations, each of the delay elements 556 is identical to each of the delay elements 558. In some implementations, one or more of the delay elements 556 and 558 can be configured to invert the signals received by the delay elements (such elements are said to be "inverting"). In some other implementations, all of the delay elements 556 and 558 are inverting. In some other implementations, none of the delay elements 556 and 558 is inverting. In some digital implementations, each of the delay elements 556 and 558 can be or can include one or multiple inverters (e.g., a NOT gate) or some other suitable arrangement of NAND, NOR, or other logic gates configured to introduce a delay. The delay introduced by each delay element 556 and 558 is a function of the control signal Cntrl transmitted to each delay element. In some analog implementations, each of the delay elements 556 and 558 can include a comparator, such as a current-controlled comparator configured to control the delay based on a current in the control signal Cntrl supplied to the comparator.

The master delay block 552 further includes a loop control block 560. The loop control block 560 is configured to receive the reference clock signal $Clk_{Ref}$ and a feedback signal $Clk_{FB}$, and to generate the control signal Cntrl based on the reference clock signal $Clk_{Ref}$ and the feedback signal $Clk_{FB}$. In implementations in which the circuit 550 is implemented in the host 102, the reference clock signal $Clk_{Ref}$ can be generated within the host 102 such as by, for example, the oscillator 432. In some implementations in which the circuit 550 is implemented in the client 104, the reference clock signal $Clk_{Ref}$ can be obtained from some internal circuitry within the client 104 that, for example, loops back or otherwise generates the reference clock signal $Clk_{Ref}$ from a reference clock signal or other clock signal obtained from the host 102 over the interface 106. For example, the host 102 can continuously transmit a reference clock signal $Clk_{Ref}$ to the client 104 regardless of whether or not the host 102 or the client 104 is communicating data. But, in the implementations described below with reference to FIGS. 6-8, the host 102 may not send a continuous reference clock signal to the client 104; rather, the client 104 internally generates a reference clock signal. Generally, the reference clock signal $Clk_{Ref}$ sent to the circuit 550 can be any clock signal having the same frequency as the clock signal Clk (e.g., $Clk_2$) sent with the data signal Dat (e.g., $Dat_2$). For example, in some implementations the frequency of the clock signals $Clk_1$ or $Clk_2$ can be in the range of tens, hundreds, or thousands of megahertz (MHz).

As shown, the delay elements 556 can be arranged in a serial configuration. Each of the delay elements 556 is configured to receive the control signal Cntrl. A first one of the delay elements 556 is configured to receive the reference clock signal $Clk_{Ref}$. A second one of the delay elements 556 receives the output of the first one of the delay elements, and so on. The first delay element 556, and each subsequent delay element 556, is configured to introduce a delay into the reference clock signal $Clk_{Ref}$ at one or both of the rising and falling clock edges of the reference clock signal. The output of the eight delay blocks 556 is a delayed clock signal—the feedback signal $Clk_{FB}$. In some implementations, the master delay block 552 is configured to delay the reference clock signal $Clk_{Ref}$ such that the feedback signal $Clk_{FB}$ is delayed relative to the reference clock signal $Clk_{Ref}$ by one reference clock cycle period (a phase shift of 360 degrees). More particularly, the loop control block 560 is configured to receive the reference clock signal $Clk_{Ref}$ and the feedback signal $Clk_{FB}$, compare the phases of the reference clock signal $Clk_{Ref}$ and the feedback signal $Clk_{FB}$, and generate the control signal Cntrl based on the comparison. For example, the control block 560 can include a phase detector (not shown) that compares the phases of the clock signals $Clk_{Ref}$ and $Clk_{FB}$ and outputs a comparison signal based on the difference in phase. The control block 560 can further include a low pass filter (not shown) that receives the comparison signal, performs a low-pass filtering operation on the comparison signal, and that outputs the filtered signal as the control signal Cntrl. The control signal Cntrl is generated such that, over the course of a number of clock cycle iterations, the phase difference between the reference clock signal $Clk_{Ref}$ and the feedback signal $Clk_{FB}$ is substantially zero; that is, the feedback signal $Clk_{FB}$ is delayed 360 degrees or one entire reference clock cycle period relative to the reference clock signal $Clk_{Ref}$. While the feedback signal $Clk_{FB}$ is delayed one entire reference clock cycle period relative to the reference clock signal $Clk_{Ref}$, the DLL circuit 550 is said to be "locked on" to the reference clock signal $Clk_{Ref}$.

In implementations in which all the delay elements 556 are substantially identical, each of the delay elements 556 introduces substantially the same delay on the rising clock edge of the reference clock signal $Clk_{Ref}$ as the other delay elements 556. Similarly, each of the delay elements 556 introduces substantially the same delay on the falling clock edge of the reference clock signal $Clk_{Ref}$ as the other delay elements 556. However, it should be noted that the delay introduced by each delay element 556 on the rising clock edges of the reference clock signal $Clk_{Ref}$ may differ from the delay introduced on the falling clock edges of the reference clock signal $Clk_{Ref}$. Similarly, in implementations in which all the delay elements 558 of the slave delay block 554 are substantially identical, each of the delay elements 558 introduces substantially the same delay on the rising clock edge of the clock signal Clk (e.g., $Clk_2$) as the other delay element 558. Similarly, each of the delay elements 558 introduces substantially the same delay on the falling clock edge of the clock signal Clk as the other delay element 558. However, the delay introduced by each delay element 558 in the slave delay block 554 on the rising clock edges of the clock signal Clk may differ from the delay introduced on the falling clock edges of the clock signal Clk.

The difference in the delays introduced on the rising and falling clock edges can be an artifact of the physical structure of the delay element 556 or 558 and can depend on the configuration or implementation of the delay element 556 or 558. In some implementations in which each of the delay elements 556 inverts the signal received by the delay element, when one delay element of a pair 562 of adjacent delay elements is receiving a rising clock edge, the adjacent delay element of the pair is receiving a falling clock edge, and vice versa, because of the inversion. Thus, for example, on any given edge of the reference clock signal $Clk_{Ref}$, while each of two adjacent delay elements 556 of a pair 562 may not necessarily be introducing the same delay (because one is receiving a rising edge and one is receiving a falling edge), each pair 562 of adjacent delay elements 556 introduces the same delay as the other pairs 562. As described above, when the DLL circuit 550 is locked on to the reference clock signal $Clk_{Ref}$, the feedback signal $CLK_{FB}$ is delayed relative to the reference clock signal $Clk_{Ref}$ by one clock cycle period or 360 degrees. Thus, because each of the delay elements 556 is substantially identical, it follows that the value of the control signal Cntrl is such that each pair 562 of the four pairs of delay elements 556 is introducing about a 90 degree phase shift (delay) into the reference clock signal $Clk_{Ref}$.

The control signal Cntrl also is routed to the delay elements 558 in the slave delay block 554. In implementations in which each delay element 558 is substantially identical to each delay element 556, when the DLL circuit 550 is locked on to the reference clock signal $Clk_{Ref}$, it follows that the value of the control signal Cntrl is such that the pair of delay elements 558 in the slave delay block 554 also is introducing about a 90 degree phase shift (delay) into the clock signal Clk. In this way, the slave delay block 554 produces a strobe signal Strb that is delayed from the data signal Dat by about 90 degrees. For example, when the slave delay block 554 is implemented in the host 102, the slave delay block 554 can be configured to delay the clock signal $Clk_2$ by 90 degrees to produce a strobe signal $Strb_2$.

In some analog implementations, each delay element 556 or 558 is configured to delay the corresponding received signal only on the rising edge of the signal and not on the falling edge (or negligibly on the falling edge). In some such implementations in which each of the delay elements 556 and 558 inverts the signal received by the delay element, when one delay element is receiving a rising clock edge, the adjacent delay element is receiving a falling clock edge, and vice versa, because of the inversion. In such analog implementations, because only one of the delay elements 556 of a given pair 562 of delay elements is receiving the rising clock edge (the other is receiving a falling clock edge), only this one of the delay elements 556 is introducing a delay (or non-negligible delay) into the reference clock signal $Clk_{Ref}$ on any given clock edge. Similarly, because only one of the delay elements 558 of the slave delay block 554 is receiving the rising clock edge, only this one of the delay elements 558 is introducing a delay (or non-negligible delay) into the clock signal Clk on any given clock edge.

In such analog implementations, as described above, when the phase difference between the reference clock signal $Clk_{Ref}$ and the feedback signal $Clk_{FB}$ is substantially zero, the feedback signal $Clk_{FB}$ is delayed relative to the reference clock signal $Clk_{Ref}$ by one clock cycle period or 360 degrees. Thus, because each of the delay elements 556 is identical, it again follows that the value of the control signal Cntrl is such that each pair 562 of the four pairs of delay elements 556 is again introducing about a 90 degree phase shift (delay) into the reference clock signal $Clk_{Ref}$ (although it may be that only one of the delay elements 556 in the pair 562 is introducing the delay). In implementations in which each delay element 556 is substantially identical to each delay element 558, the result is the same as described above. Because each of the delay elements 558 is identical to each of the delay elements 556, it follows that the value of the control signal Cntrl is such that the pair of delay elements 558 in the slave delay block 554 also is introducing about a 90 degree phase shift (delay) into the clock signal Clk to produce the strobe signal Strb.

Generally, because the reference clock signal $Clk_{Ref}$ is generated externally to the DLL circuit 550, it can take some time for the control loop block 560 to lock on to the reference clock signal $Clk_{Ref}$, or more particularly, to lock the feedback signal $Clk_{FB}$ onto the reference clock signal $Clk_{Ref}$ such that the feedback signal $Clk_{FB}$ is delayed relative to the reference clock signal $Clk_{Ref}$ by one reference clock cycle period. For example, it can take hundreds of clock cycles or more for the feedback signal $Clk_{FB}$ to be phase-aligned with the reference clock signal $Clk_{Ref}$ such that the feedback signal $Clk_{FB}$ is delayed one full clock cycle period relative to the reference clock signal $Clk_{Ref}$. Additionally, the control loop block 560 may lose the lock if the reference clock signal $Clk_{Ref}$ changes too fast or too much.

Figure 6:
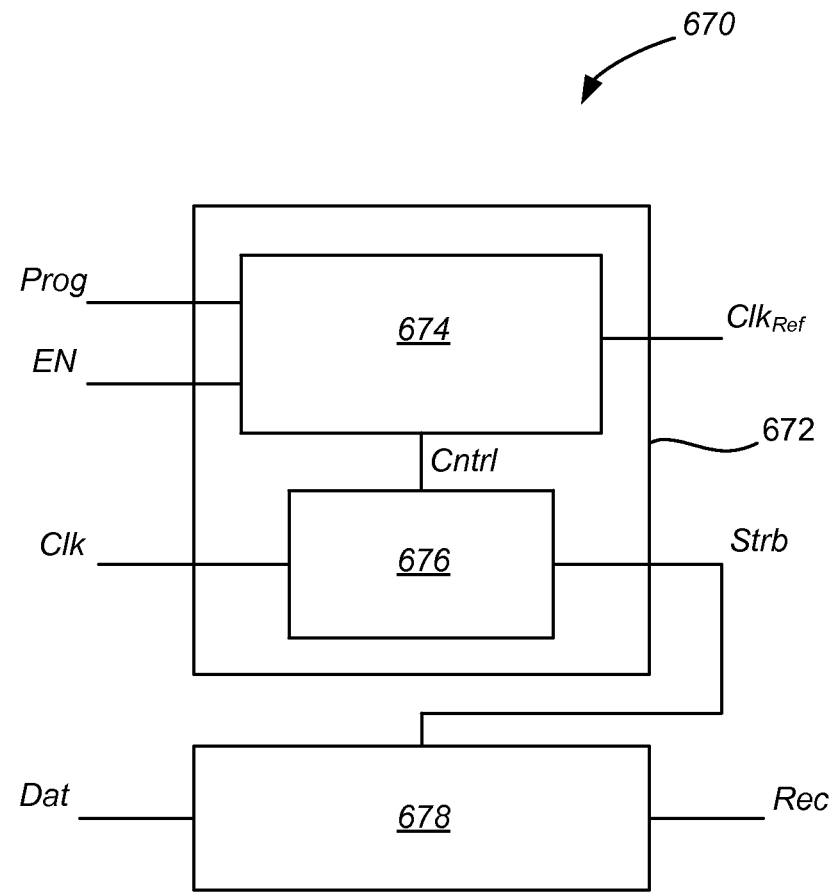
FIG. 6 shows a data recovery circuit.

FIG. 6 shows a data recovery circuit 670. In some implementations, the data recovery circuit 670 is configured for use in the client 104. In some implementations, the data recovery circuit 670 also can be configured for use in the host 102. The data recovery circuit 670 includes a clock generation and delay circuit 672. Unlike the DLL circuit 432 described above with reference to FIGS. 4 and 5, the clock generation and delay circuit 672 does not receive an external reference signal $Clk_{Ref}$. In particular, functions of the oscillator and the DLL circuit are merged or combined in the clock generation and delay circuit 672.

The clock generation and delay circuit 672 includes an oscillator circuit 674 and a slave delay block 676. The oscillator circuit 674 is configured to receive an enable signal EN and to generate an internal reference clock signal $Clk_{Ref}$ whenever enabled by the enable signal EN. That is, the oscillator circuit 674 can be said to be self-oscillating. In some implementations, the host 102 can transmit the enable signal EN to the client 104 to cause the client 104 to prepare to receive the data signal $Dat_1$ and the clock signal $Clk_1$. In some other implementations, the enable signal EN may change logic states (thus enabling the oscillator circuit 674) when a data signal Dat (e.g., $Dat_1$ or $Dat_2$) or clock signal Clk (e.g., $Clk_1$ or $Clk_2$) is received by the data recovery circuit 670. The oscillator circuit 674 also generates a control signal Cntrl, as described below.

The slave delay block 676 is configured to receive a clock signal Clk, such as the clock signal $Clk_1$ or $Clk_2$ of FIG. 1, transmitted with a data signal Dat, such as the data signal $Dat_1$ or $Dat_2$ of FIG. 1, respectively. The slave delay block 676 is configured to delay the clock signal Clk based on the control signal Cntrl to produce a strobe signal Strb having a desired phase shift (e.g., about 180 degrees for SDR or about 90 degrees for DDR) relative to the clock signal Clk. The strobe signal Strb is then sent to the sampler 678, which samples the data in the data signal Dat based on the edges of the strobe signal Strb to generate a recovered data signal Rec.

Figure 7:
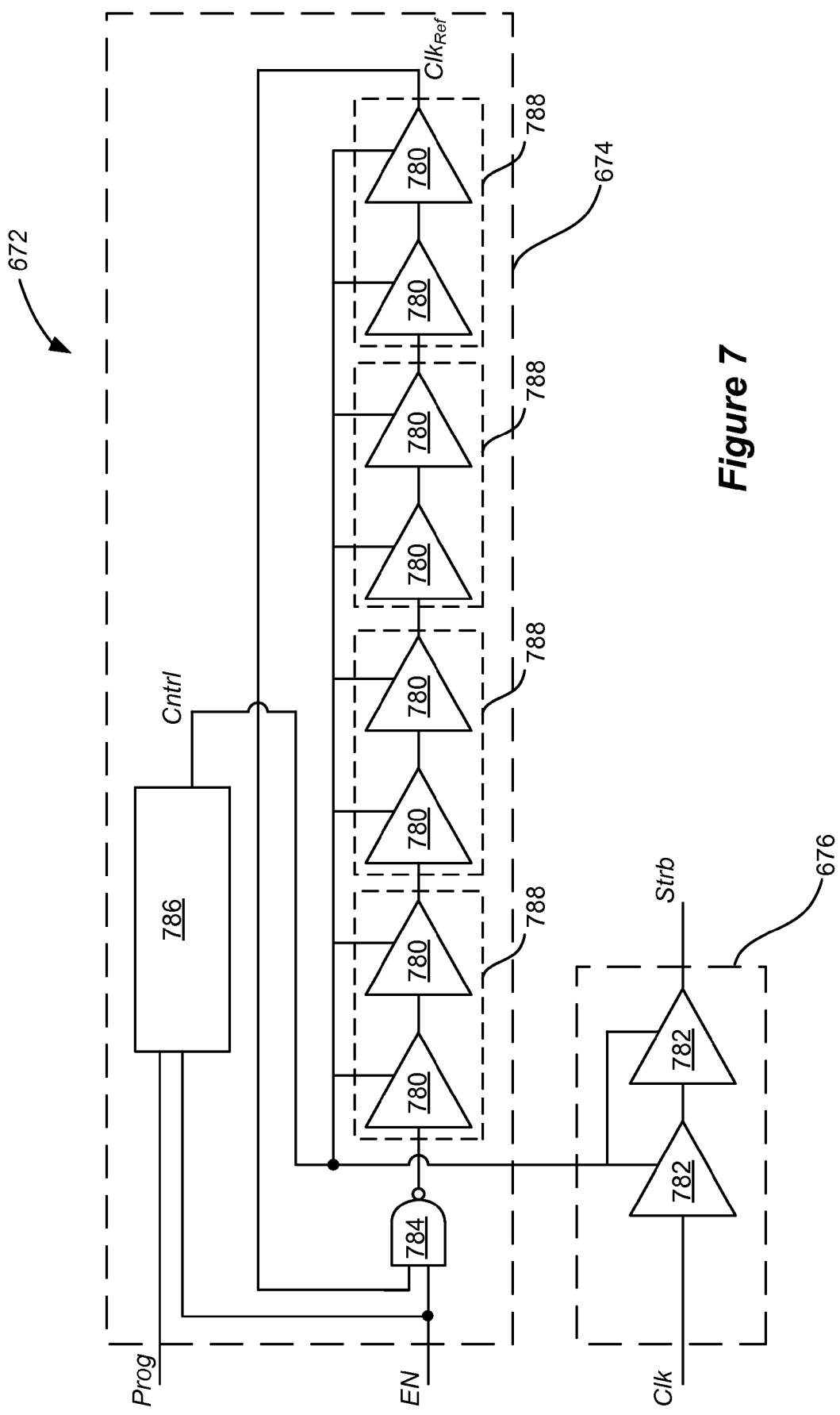
FIG. 7 shows an example implementation of a clock generation and delay circuit that includes an open loop design.

FIG. 7 shows one example implementation of a clock generation and delay circuit 672 that includes an open loop design. Like the DLL circuit 550 of FIG. 5, each of the oscillator circuit 674 and the slave delay block 676 includes a number of delay elements. In particular, the delay elements 780 of the oscillator circuit 674 are arranged generally in a relaxation oscillator configuration to generate the internal reference clock signal $Clk_{Ref}$. In the illustrated implementation, the oscillator circuit 674 includes eight delay elements 780 arranged, more particularly, in a delay line oscillator configuration, and even more particularly, in a delay-based ring oscillator configuration. In some implementations, the slave delay block 676 includes two delay elements 782 arranged as, for example, the delay elements 558 of the slave delay block 554 of FIG. 5. In some implementations, each of the delay elements 780 is substantially identical to each of the delay elements 782. In some digital implementations, each of the delay elements 780 and 782 can be or can include one or more inverters or some other suitable arrangement of NAND, NOR, or other logic gates configured to introduce a delay. Like the circuit 550 of FIG. 5, the delay introduced by each delay element 780 and 782 is a function of the control signal Cntrl transmitted to each delay element. In some analog implementations, each of the delay elements 780 and 782 can include a comparator, such as a current-controlled comparator configured to control the delay based on a current in the control signal Cntrl supplied to the comparator.

The oscillator circuit 674 begins self-oscillating to produce the internal reference clock signal $Clk_{Ref}$ when triggered by the enable signal EN. In the illustrated implementation, the oscillator circuit 674 includes a NAND gate 784 that receives the enable signal EN and the internal reference clock signal $Clk_{Ref}$ (itself generated at the output of the delay elements 780) and performs a NAND logic operation on these inputs. The output of the NAND gate 784 is sent to the first one of the delay elements 780. As a result, when the enable signal EN is at the proper logic state (e.g., high) the oscillator circuit 674 generates the internal reference clock signal $Clk_{Ref}$ and passes the reference clock signal $Clk_{Ref}$, via the NAND gate 784, back through the line of delay elements 780. Generally, ring oscillators comprised of inverting delay elements typically include an odd number of inverting elements. In the illustrated implementation, because the oscillator circuit 674 includes an even number of inverting delay elements 780, the inclusion of the inverting NAND gate 784 provides an odd number of inverting elements. In other implementations, a different type of gate or array of gates can be used instead of the NAND gate 784 to receive the enable signal EN and to facilitate the feedback loop from the output of the last delay element 780 to the input of the first delay element 780. For example, a NOR gate can be used rather than a NAND gate. In such an implementation, the enable signal EN may be inverted prior to input into the NOR gate.

Of note, because the reference clock signal $Clk_{Ref}$ output from the last delay element 780 is fed back to the front of the line of delay elements 780, the time required to "lock" the reference clock signal $Clk_{Ref}$ can be significantly shortened or substantially eliminated. That is, the oscillator circuit 674 begins oscillating substantially immediately to produce the reference clock signal $Clk_{Ref}$ as described more fully below. This is in contrast to the circuits described above with reference to FIGS. 4 and 5, which can require hundreds or more clock cycles for the control loop block 560 to lock the feedback signal $Clk_{FB}$ onto the externally-generated reference signal $Clk_{Ref}$.

The oscillator circuit 674 further includes a delay control block 786. In the illustrated open loop implementation, the delay control block 786 is configured to generate the control signal Cntrl when the delay control block 786 is enabled by the enable signal EN. In such open loop implementations, the delay control block 786 generates a static (or statically-valued) control signal Cntrl during operation of the oscillator circuit 674. The delay control block 786 can adjust the static value of the control signal Cntrl based on a value of a program signal Prog. For example, the program signal Prog can be a multi-bit bus that can be configured to provide one of a plurality of input values to the delay control block 786. As described further below, the value of the program signal Prog input to the delay control block 786 can be utilized to adjust the value of the static control signal Cntrl and thus be used to adjust the frequency of the reference clock signal $Clk_{Ref}$.

Figure 8:
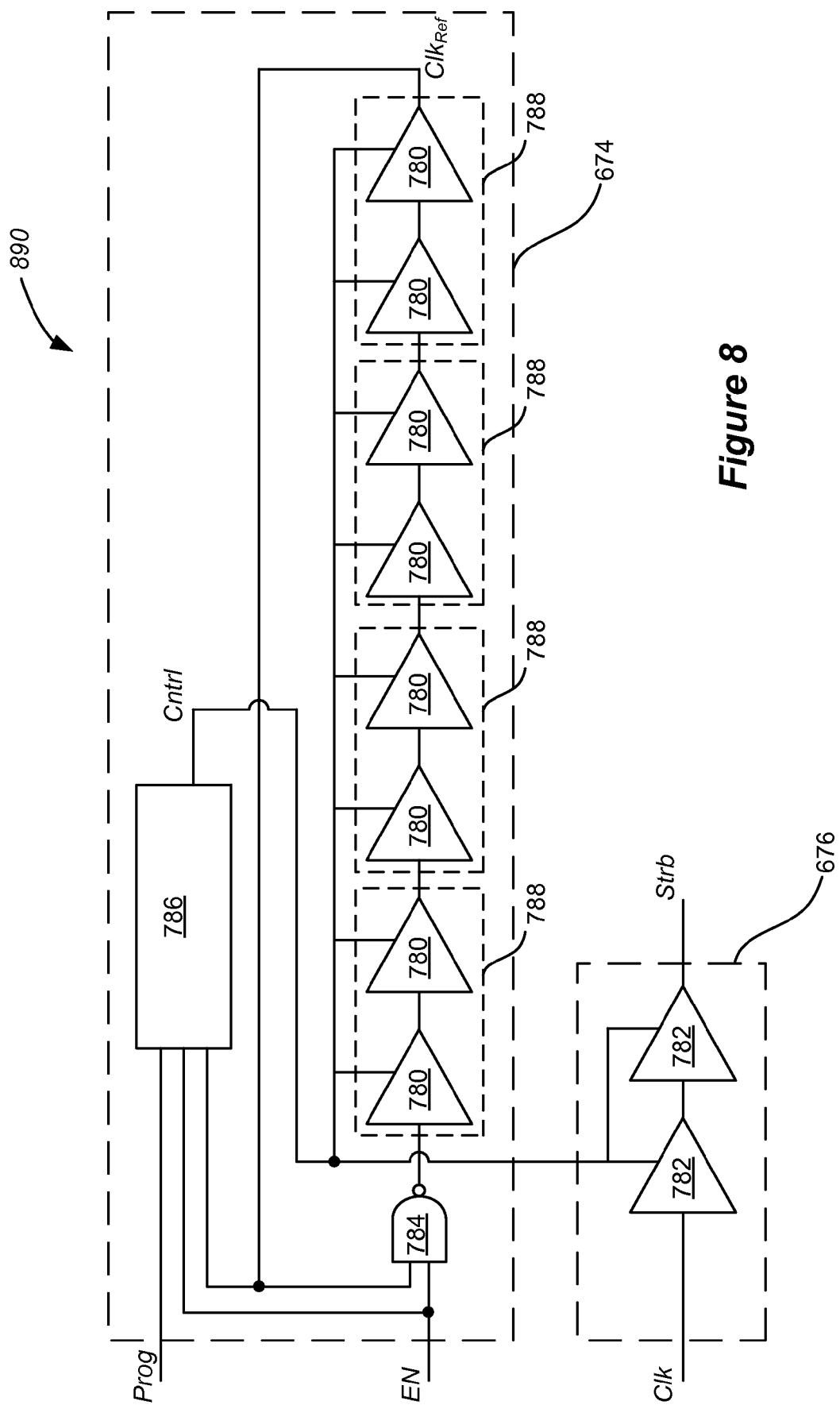
FIG. 8 shows an example implementation of a clock generation and delay circuit that includes a closed loop design.

FIG. 8 shows one example implementation of a clock generation and delay circuit 890 that includes a closed loop design. The clock generation and delay circuit 890 of FIG. 8 can be substantially identical to the clock and generation circuit 672 of FIG. 7 except that the circuit 890 of FIG. 8 includes a closed loop design. In the illustrated closed loop implementation, the delay control block 786 is again configured to generate the control signal Cntrl when the delay control block 786 is enabled by the enable signal EN. However, in the circuit 890 of FIG. 8, the reference clock signal $Clk_{Ref}$ also is input as feedback to the delay control block 786. In such closed loop implementations, the delay control block 786 can function to generate the control signal Cntrl during operation of the oscillator circuit 674 such that the value of the reference clock signal $Clk_{Ref}$ is constant. In such closed loop implementations, the delay control block 786 also can adjust the value of the control signal Cntrl based on a value of a program signal Prog as described above with reference to FIG. 7. More specifically, the value of the program signal Prog input to the delay control block 786 can be utilized in conjunction with the reference clock signal $Clk_{Ref}$ to adjust the value of the control signal Cntrl and thus to adjust the frequency of the reference clock signal $Clk_{Ref}$ such that the frequency has a constant value for a given value of the program signal Prog.

In both of the clock generation and delay circuits 672 and 890 of FIGS. 7 and 8, respectively, each of the delay elements 780 is configured to receive the control signal Cntrl. The control signal Cntrl sets the delay introduced by each delay element 780. A first one of the delay elements 780 is configured to receive the reference clock signal $Clk_{Ref}$ that is itself generated at the output of the line of delay elements 780. A second one of the delay elements 780 receives the output of the first one of the delay elements, and so on. The first delay element 780, and each subsequent delay element 780, is configured to introduce a delay into the reference clock signal $Clk_{Ref}$ at one or both of the rising and falling clock edges of the reference clock signal. The output of the line of delay elements 780 is itself the reference clock signal $Clk_{Ref}$; that is, the output of the line of delay elements 780 is fed back as the input as described above. In this manner, the line of delay elements 780 forms a feedback loop that functions as a delay-based ring oscillator. The delay control block 786 generates the control signal Cntrl such that the line of delay elements 780 oscillates to produce the reference clock signal $Clk_{Ref}$. Because the reference clock signal $Clk_{Ref}$ is internally generated, the delay control block 786 is able to generate the control signal Cntrl whenever the oscillator circuit 674 is running (e.g., when enabled by the enable signal EN) and to generate the control signal Cntrl such that the oscillator circuit 674 oscillates to generate the reference clock signal $Clk_{Ref}$.

As described above, in open loop implementations such as that shown in FIG. 7, the value of the control signal Cntrl is fixed for a given value of the program signal Prog. Because the value of the control signal Cntrl is fixed for a given value of the program signal Prog, the delay introduced by each delay element 780 also is fixed for a given value of the program signal Prog. Because the delay introduced by each delay element 780 is fixed for a given value of the program signal Prog, the frequency of oscillation of the oscillator circuit 674, and thus the frequency of the reference clock signal $Clk_{Ref}$, also is fixed for a given value of the program signal Prog. However, by changing the value of the program signal Prog, different delays and hence different reference clock $Clk_{Ref}$ frequencies can be obtained.

In some closed loop implementations, the frequency of the reference clock signal $Clk_{Ref}$ is converted to a voltage signal or a current signal using a frequency-to-voltage converter (not shown) or a frequency-to-current converter (not shown), respectively. In such implementations, the delay control block 786 can include logic, such as a comparator circuit, that is configured to compare the voltage or current signal with some reference voltage signal or reference current signal, and to generate the control signal Cntrl based on the result of the comparison. In some such implementations, the program signal Prog can be used to change or vary the reference voltage signal or the reference current signal.

As described above with reference to the circuit 550 of FIG. 5, in implementations of the oscillator circuit 674 in which all the delay elements 780 are substantially identical, each of the delay elements 780 introduces substantially the same delay on the rising clock edge of the reference clock signal $Clk_{Ref}$ as the other delay elements 780. Similarly, each of the delay elements 780 introduces the same delay on the falling clock edge of the reference clock signal $Clk_{Ref}$ as the other delay elements 780. However, the delay introduced by each delay element 780 on the rising clock edges of the reference clock signal $Clk_{Ref}$ may differ from the delay introduced on the falling clock edges of the reference clock signal $Clk_{Ref}$. Similarly, in implementations in which all the delay elements 782 of the slave delay block 676 are substantially identical, each of the delay elements 782 introduces the same delay on the rising clock edge of the clock signal Clk (e.g., $Clk_1$ of FIG. 1) as the other delay element 782. Similarly, each of the delay elements 782 introduces the same delay on the falling clock edge of the clock signal Clk as the other delay element 782. However, the delay introduced by each delay element 782 in the slave delay block 676 on the rising clock edges of the clock signal Clk may differ from the delay introduced on the falling clock edges of the clock signal Clk.

The difference in the delays introduced on the rising and falling clock edges also can be an artifact of the physical structure of the delay element 780 or 782 and can depend on the configuration or implementation of the delay element 780 or 782. In some implementations in which each of the delay elements 780 inverts the signal received by the delay element, when one delay element of a pair 788 of adjacent delay elements is receiving a rising clock edge, the adjacent delay element of the pair is receiving a falling clock edge. Thus, for example, on any given edge of the reference clock signal $Clk_{Ref}$, while each of two adjacent delay elements 780 may not necessarily be introducing the same delay (because one is receiving a rising edge and one is receiving a falling edge), each pair 788 of adjacent delay elements 780 introduces the same delay as the other pairs 788. However, when the delay elements 780 in the oscillator circuit 674 are oscillating to produce the reference clock signal $Clk_{Ref}$, because each of the delay elements 780 is substantially identical, and because an inherent delay introduced by the NAND gate 784 is small or negligible relative to the delay introduced by each delay element 780, it follows that the value of the control signal Cntrl is such that each pair 788 of the four pairs of delay elements 780 is introducing about a 90 degree phase shift (delay) into the reference clock signal $Clk_{Ref}$. In other words, the NAND gate 784 effectively passes the output of the last delay element 780 of the oscillator circuit 674 to the input of the first delay element 780 of the oscillator circuit 674 when enabled by the enable signal EN thus forming a "ring." Consequently, because the NAND gate 784 introduces only a small or negligible phase shift, the phase of the signal output from the last delay element 780 of the oscillator circuit 674 is substantially or effectively the same as the phase of the signal input to the first delay element 780 of the oscillator circuit 674. Thus, the collective phase shift or delay introduced by all of the delay elements 780 combined is approximately zero degrees, or equivalently, 360 degrees. Thus, because there are four pairs 788 of delay elements 780, each pair 788 introduces approximately a 360/4=90 degree phase shift or delay.

The control signal Cntrl also is routed to the delay elements 782 in the slave delay block 676. In implementations in which each delay element 782 is substantially identical to each delay element 780, it follows that the value of the control signal Cntrl is such that the pair of delay elements 782 in the slave delay block 676 also is necessarily introducing about a 90 degree phase shift (delay) into the clock signal Clk to produce the strobe signal Strb. For example, when the slave delay block 676 is implemented in the client 104, the slave delay block 676 can be configured to delay the clock signal $Clk_1$ of FIG. 1 by about 90 degrees to produce a strobe signal $Strb_1$. Similarly, when the slave delay block 676 is implemented in the host 102, the slave delay block 676 can be configured to delay the clock signal $Clk_2$ of FIG. 1 by about 90 degrees to produce a strobe signal $Strb_2$.

Again, in some other implementations, the delay elements 782 of the slave delay block 676 can be different than the delay elements 780 of the oscillator circuit 674 so as to generate a different phase shift other than 90 degrees. For example, the sizes of the inverters or the gate widths of the transistors used to form the logic gates of the delay elements 782 of the slave delay block 676 can be sized differently relative to those used to form the delay elements 780 of the oscillator circuit 674. In some other implementations, the number of delay elements 780, or the number or arrangement of pairs 788, can be changed to achieve a different phase delay. For example, in implementations in which there are eight pairs 788 of delay elements 780, each pair would necessarily contribute a 45 degree phase delay. Thus, in implementations in which the delay elements 780 are substantially identical to the delay elements 782, a slave delay block that includes a single pair of delay elements 782 would introduce a 45 degree phase delay into the clock signal Clk.

As described above with reference to FIG. 5, in some analog implementations, each delay element 780 or 782 is configured to delay the corresponding received signal only on the rising edge of the signal and not (or negligibly) on the falling edge. In some such implementations in which each of the delay elements 780 and 782 inverts the signal received by the delay element, when one delay element is receiving a rising clock edge, the adjacent delay element is receiving a falling clock edge. For example, because only one of the delay elements 780 of a given pair 788 of delay elements is receiving the rising clock edge (the other is receiving a falling clock edge), only this one of the delay elements 780 is introducing a delay into the reference clock signal $Clk_{Ref}$ on any given clock edge. Similarly, because only one of the delay elements 782 of the slave delay block 554 is receiving the rising clock edge, only this one of the delay elements 782 is introducing a delay into the clock signal Clk on any given clock edge.

In such analog implementations, as described above, when the oscillator circuit 674 is oscillating to generate the reference clock signal $Clk_{Ref}$, because each of the delay elements 780 is substantially identical, it again follows that the value of the control signal Cntrl is such that each pair 788 of the four pairs of delay elements 780 is again introducing about a 90 degree phase shift (delay) into the reference clock signal $Clk_{Ref}$. In implementations in which each delay element 780 is substantially identical to each delay element 782, the result is the same as described above. Because each of the delay elements 782 is substantially identical to each of the delay elements 780, it follows that the value of the control signal Cntrl is such that the pair of delay elements 782 in the slave delay block 676 also is necessarily introducing about a 90 degree phase shift (delay) into the clock signal Clk to produce the strobe signal Strb.

Figure 9:
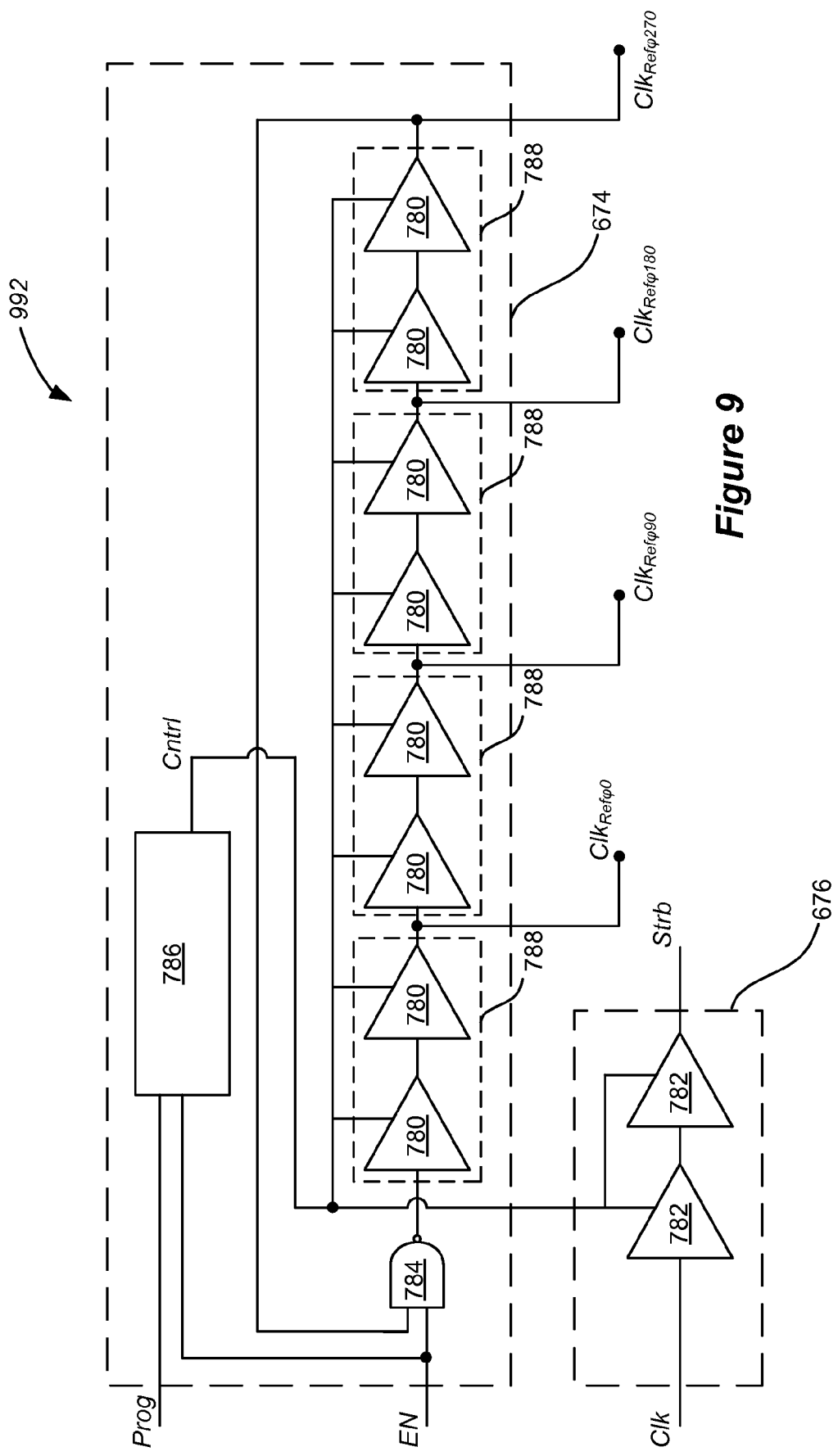
FIG. 9 shows an example implementation of a clock generation and delay circuit that is further configured to generate a multi-phase clock.

Additionally, in some implementations, a multi-phase reference clock can be generated by outputting or "tapping" the reference clock signal at multiple locations within the line of delay elements 780. FIG. 9 shows an example implementation of a clock generation and delay circuit 992 similar to the clock generation and delay circuit 672 of FIG. 7 but further configured to generate a multi-phase clock. For example, the reference clock signal can be output after each pair 788 of delay elements 780 to produce a first reference clock signal $Clk_{Ref\phi 0}$, a second reference clock signal $Clk_{Ref\phi 90}$ having a delay of 90 degrees relative to the first reference clock signal $Clk_{Ref\phi 0}$, a third reference clock signal $Clk_{Ref\phi 180}$ having a delay of 180 degrees relative to the first reference clock signal $Clk_{Ref\phi 0}$, and a fourth reference clock signal $Clk_{Ref\phi 270}$ having a delay of 270 degrees relative to the first reference clock signal $Clk_{Ref\phi 0}$.

Additionally, in some other implementations, the slave delay block 676 can include additional delay elements 782. For example, each additional pair of delay elements 782 can introduce an additional (e.g., 90 degree) phase shift into the strobe signal Strb. Similarly, a multiphase strobe signal Strb can be produced by outputting the strobe signal after each pair of delay elements 782. In some other implementations, the clock generation and delay circuit 672 can include a plurality of slave delay blocks 676 arranged in parallel. For example, in this way, a single clock generation and delay circuit 992 can provide the necessary delays to a plurality of clock signals with each slave delay block being suitable for use in receiving and delaying an individual one of multiple received clock signals.

Figure 10:
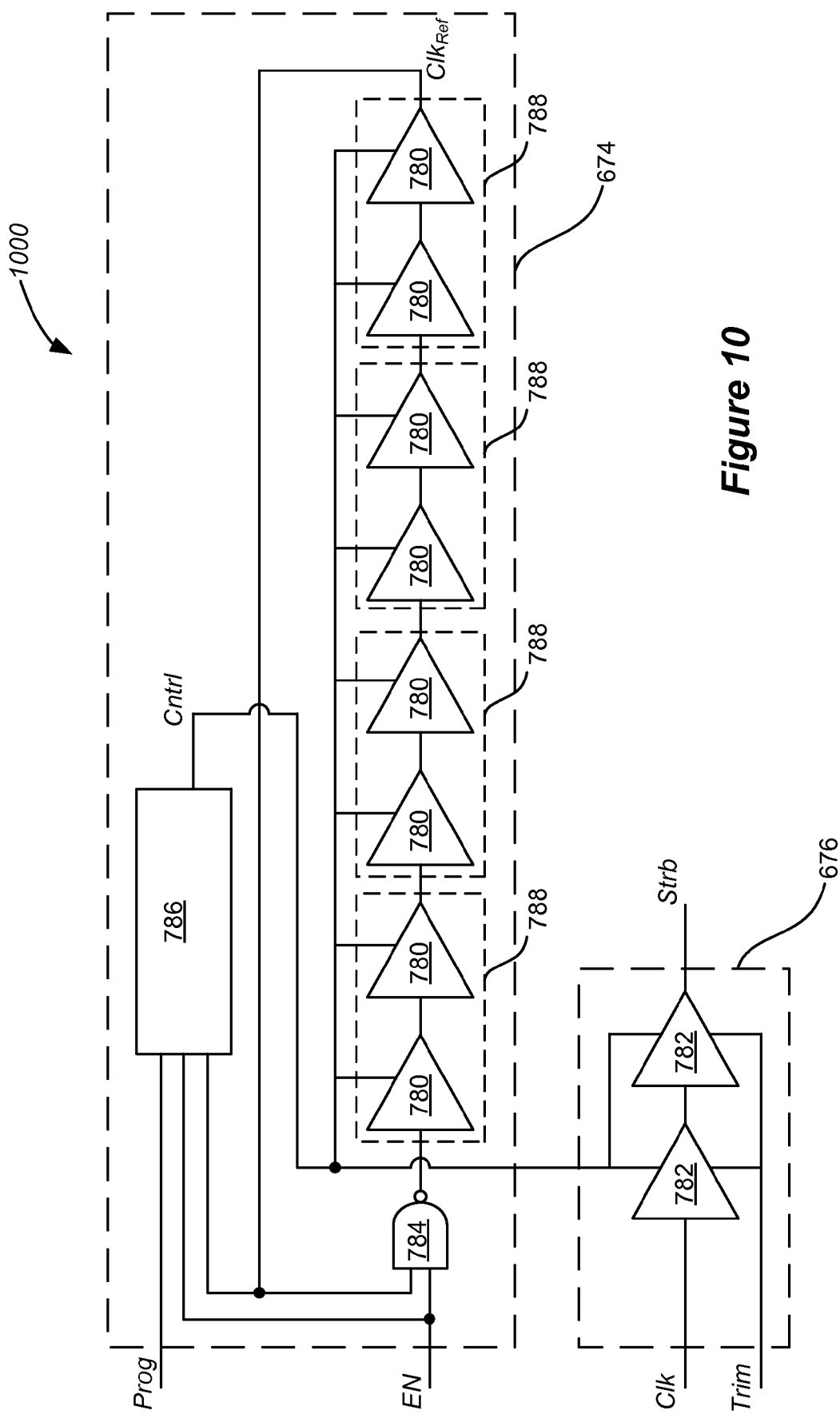
FIG. 10 shows an example implementation of a clock generation and delay circuit that is further configured to trim or skew the delay introduced by the slave delay block.

FIG. 10 shows an example implementation of a clock generation and delay circuit 1000 that is further configured to trim or skew the delay introduced by a slave delay block 676. For example, the clock generation and delay circuit 1000 can be substantially identical to or similar to the clock generation and delay circuit 890 described with reference to FIG. 8 except for the inclusion of an additional trim signal Trim. The clock generation and delay circuit 1000 can be used to trim or skew the delay introduced into the clock signal Clk when generating the strobe signal Strb to compensate, for example, for differences in the physical paths taken by the clock and data signals Clk and Dat, respectively. As shown, the additional trim signal Trim is input to the delay elements 782 in the slave delay block 676. Based on the value of the trim signal Trim, the delay introduced by each of the delay elements 782 in the slave delay block 676 is skewed to compensate for such path differences. In this manner, the delay introduced by the slave delay block 676 can be changed without changing the delay introduced by the delay elements 780, and also without changing the frequency of the reference clock signal $Clk_{Ref}$. In some applications, the trim signal Trim also can be used to test the DLL functionality of the clock generation and delay circuit 1000. For example, the trim signal Trim also can be used to test the DLL design margin; that is, to determine the maximum path differences or otherwise to test the ability of the clock generation and delay circuit 1000 to generate the correct delay in the strobe signal Strb relative to the data signal Dat. In some other implementations, the trim signal Trim can be used similarly in conjunction with the clock generation and delay circuit 672 of FIG. 7.

Although a specific clock generation and delay circuit 672 and oscillator circuit 674 have been described, in some other implementations, other oscillator configurations can be utilized. Generally, various implementations can be made to work with any delay-based relaxation oscillator configuration. In such implementations, the same delay elements used to generate the reference clock signal $Clk_{Ref}$ also are used to implement the DLL functionality to generate the control signal Cntrl sent to the slave delay block 676 to delay the clock signal Clk used to sample the data signal Dat.

Additionally, in implementations in which it may be desirable to include a regulator to stabilize the power supply or to reduce jitter, a single regulator can be used. This is in contrast to traditional circuits that can require a regulator in an oscillator and a regulator in a separate DLL circuit. Furthermore, by incorporating the functionality of a DLL circuit with the oscillator circuit, savings in both area (e.g., silicon die area) as well as power can be achieved because the delay elements used by the oscillator also serve to provide the DLL functionality that generates the control signal for the slave delay block.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

What is claimed is:

1. A circuit comprising:
a control block configured to generate a common control signal, wherein the control block is further configured to receive a program signal, and the control block generates the common control signal based on the program signal;
an oscillator configured to generate a reference clock signal, the oscillator including a plurality of delay elements, each delay element of the oscillator being configured to receive the common control signal and to introduce a delay in the reference clock signal based on the common control signal, the delay elements of the oscillator being collectively arranged so as to generate the reference clock signal when the oscillator is oscillating; and
a delay block configured to receive a data clock signal and to generate a delayed clock signal, the delay block including one or more delay elements, each delay element of the delay block being configured to receive the common control signal and to introduce a delay in the data clock signal based on the common control signal, the delay elements of the delay block being arranged so as to delay the data clock signal to generate the delayed clock signal.

2. The circuit of claim 1, wherein the value of the common control signal is fixed for a given value of the program signal.

3. The circuit of claim 1, wherein the control block is further configured to:
receive the reference clock signal;
convert a frequency of the reference clock signal to a voltage signal or a current signal;
produce a reference voltage signal or a reference current signal based on the program signal;
compare the voltage or current signal with the reference voltage or reference current signal, respectively; and
generate the common control signal based on the comparison.

4. The circuit of claim 1, wherein the delay elements of the oscillator are arranged in a relaxation oscillator configuration.

5. The circuit of claim 4, wherein the delay elements of the oscillator are arranged in a delay-based ring oscillator configuration.

6. The circuit of claim 5, further comprising an inverting logic gate configured to receive as input an enable signal and the reference clock signal, the output of the inverting logic gate being coupled to a first one of the delay elements of the oscillator, the enable signal being configured to trigger oscillation of the oscillator.

7. The circuit of claim 6, wherein:
the oscillator includes eight serially-coupled delay elements arranged in four serially-coupled pairs; and
each pair of delay elements in the oscillator is configured to introduce an approximately 90 degree phase delay in the reference clock signal when receiving the common control signal.

8. The circuit of claim 7, wherein the delay elements of the oscillator are substantially identical to the delay elements of the delay block.

9. The circuit of claim 8, wherein the delay block includes two serially-coupled delay elements, the two delay elements of the delay block being configured to introduce an approximately 90 degree phase delay in the data clock signal when receiving the common control signal.

10. The circuit of claim 4, wherein each delay element includes an inverter or inverting circuit.

11. A circuit comprising:
a control block configured to generate a common control signal, wherein the control block is further configured to receive a program signal, and the control block generates the common control signal based on the program signal;
an oscillator configured to generate a reference clock signal, the oscillator including a plurality of delay elements, each delay element of the oscillator being configured to receive the common control signal and to introduce a delay in the reference clock signal based on the common control signal, the delay elements of the oscillator being collectively arranged so as to generate the reference clock signal when the oscillator is oscillating;
a delay block configured to receive a data clock signal and to generate a delayed clock signal, the delay block including one or more delay elements, each delay element of the delay block being configured to receive the common control signal and to introduce a delay in the data clock signal based on the common control signal, the delay elements of the delay block being arranged so as to delay the data clock signal to generate the delayed clock signal; and
a data sampler configured to receive a data signal comprising bits of data and to sample the data signal based on the delayed clock signal.

12. The circuit of claim 11, wherein:
the data clock signal is transmitted only with the data signal.

13. The circuit of claim 11, wherein the value of the common control signal is fixed for a given value of the program signal.

14. The circuit of claim 11, wherein the control block is further configured to:
receive the reference clock signal;
convert a frequency of the reference clock signal to a voltage signal or a current signal;
produce a reference voltage signal or a reference current signal based on the program signal;
compare the voltage or current signal with the reference voltage or reference current signal, respectively; and
generate the common control signal based on the comparison.

15. The circuit of claim 11, wherein the delay elements of the oscillator are arranged in a relaxation oscillator configuration.

16. The circuit of claim 15, wherein the delay elements of the oscillator are arranged in a delay-based ring oscillator configuration.

17. The circuit of claim 16, further comprising an inverting logic gate configured to receive as input an enable signal and the reference clock signal, the output of the inverting logic gate being coupled to a first one of the delay elements of the oscillator, the enable signal being configured to trigger oscillation of the oscillator.

18. The circuit of claim 11, wherein the delay elements of the oscillator are substantially identical to the delay elements of the delay block.

19. The circuit of claim 18, wherein each delay element includes an inverter or inverting circuit.

20. A circuit comprising:
a control block configured to receive a program signal and to generate a common control signal based on the program signal;
an oscillator configured to generate a reference clock signal, the oscillator including a plurality of delay elements arranged in a delay-based ring oscillator configuration, each delay element of the oscillator being configured to receive the common control signal and to introduce a delay in the reference clock signal based on the common control signal, the delay elements of the oscillator being collectively arranged so as to generate the reference clock signal when the oscillator is oscillating, the reference clock signal being fed back to an input of the oscillator;
a delay block configured to receive a data clock signal and to generate a delayed clock signal, the delay block including one or more delay elements, the delay elements of the delay block being substantially identical to the delay elements of the oscillator, each delay element of the delay block being configured to receive the common control signal and to introduce a delay in the data clock signal based on the common control signal, the delay elements of the delay block being arranged so as to delay the data clock signal to generate the delayed clock signal; and a data sampler configured to receive a data signal comprising bits of data and to sample the data signal based on the delayed clock signal.

21. The circuit of claim 20, wherein:
The data clock signal is transmitted only with the data signal.

22. The circuit of claim 20, wherein the value of the common control signal is fixed for a given value of the program signal.

23. The circuit of claim 20, wherein the control block is further configured to:
   receive the reference clock signal;
   convert a frequency of the reference clock signal to a voltage signal or a current signal;
   produce a reference voltage signal or a reference current signal based on the program signal;
   compare the voltage or current signal with the reference voltage or reference current signal, respectively; and
   generate the common control signal based on the comparison.

* * * * *